US012727181B2

(12) United States Patent
Lv et al.

(10) Patent No.: US 12,727,181 B2
(45) Date of Patent: Sep. 1, 2026

(54) METHOD FOR PREPARING SCHOTTKY DIODE AND SCHOTTKY DIODE

(71) Applicant: The 13th Research Institute of China Electronics Technology Group Corporation, Shijiazhuang (CN)

(72) Inventors: Yuanjie Lv, Shijiazhuang (CN); Yuangang Wang, Shijiazhuang (CN); Hongyu Liu, Shijiazhuang (CN); Zhe Qin, Shijiazhuang (CN); Baodi Li, Shijiazhuang (CN); Baorui Sun, Shijiazhuang (CN); Guo Zhou, Shijiazhuang (CN); Aimin Bu, Shijiazhuang (CN); Zhihong Feng, Shijiazhuang (CN)

(73) Assignee: The 13th Research Institute of China Electronics Technology Group Corporation, Shijiazhuang (CN)

( * ) Notice: Subject to any disclaimer, the term of this patent is extended or adjusted under 35 U.S.C. 154(b) by 367 days.

(21) Appl. No.: 18/394,136

(22) Filed: Dec. 22, 2023

(65) Prior Publication Data

US 2026/0020267 A1 Jan. 15, 2026

Related U.S. Application Data

(63) Continuation of application No. PCT/CN2023/104758, filed on Jun. 30, 2023.

(30) Foreign Application Priority Data

Mar. 22, 2023 (CN) ........................ 202310286583.8

(51) Int. Cl.

| | |
|---|---|
| ***H10D 8/01*** | (2025.01) |
| ***H10D 8/60*** | (2025.01) |
| ***H10P 14/20*** | (2026.01) |

(52) U.S. Cl.
CPC ............... *H10D 8/051* (2025.01); *H10D 8/60* (2025.01); *H10P 14/203* (2026.01)

(58) Field of Classification Search
None
See application file for complete search history.

(56) References Cited

U.S. PATENT DOCUMENTS

| | | | | |
|---|---|---|---|---|
| 2020/0168460 | A1 * | 5/2020 | Kuramata | C30B 29/16 |
| 2022/0093748 | A1 * | 3/2022 | Miyake | H10D 8/60 |
| 2023/0369417 | A1 * | 11/2023 | Miyake | H10D 8/60 |

FOREIGN PATENT DOCUMENTS

| | | |
|---|---|---|
| CN | 101868862 A | 10/2010 |
| CN | 102308370 A | 1/2012 |

(Continued)

OTHER PUBLICATIONS

International Search Report and Written Opinion received in Patent Cooperation Treaty Application No. PCT/CN2023/104758, dated Oct. 13, 2023.

*Primary Examiner* — Bradley Smith
(74) *Attorney, Agent, or Firm* — AP3 Law Firm PLLC

(57) ABSTRACT

A method includes: oxidizing a target $N^+$-type gallium oxide substrate to obtain a first $N^-$-type gallium oxide drift layer formed on an upper surface of the target $N^+$-type gallium oxide substrate and a second $N^-$-type gallium oxide drift layer formed on a lower surface of the target $N^+$-type gallium oxide substrate; preparing a first anode electrode on an upper surface of the first $N^-$-type gallium oxide drift layer and a second anode electrode on a lower surface of the second $N^-$-type gallium oxide drift layer; cutting the target $N^+$-type gallium oxide substrate, to obtain a first $N^+$-type gallium oxide substrate and a second $N^+$-type gallium oxide substrate; and preparing a first cathode electrode on a lower surface of the first $N^+$-type gallium oxide substrate and a second cathode electrode on an upper surface of the second (Continued)

$N^+$-type gallium oxide substrate, to obtain two Schottky diodes.

14 Claims, 3 Drawing Sheets

(56) References Cited

FOREIGN PATENT DOCUMENTS

| | | |
|---|---|---|
| CN | 106887470 A | 6/2017 |
| CN | 109767990 A | 5/2019 |
| CN | 111540788 A | 8/2020 |

* cited by examiner

METHOD FOR PREPARING SCHOTTKY DIODE AND SCHOTTKY DIODE

RELATED APPLICATIONS

This application is a continuation of International Application No. PCT/CN2023/104758, filed on Jun. 30, 2023, which claims priority to Chinese Patent Application No. 202310286583.8, filed on Mar. 22, 2023. The disclosures of the aforementioned applications are hereby incorporated by reference in their entireties.

TECHNICAL FIELD

The present application relates to the technical field of diode preparation, and particularly relates to a method for preparing a Schottky diode and a Schottky diode.

BACKGROUND

Semiconductor materials play an irreplaceable role in modern information industrialization society and are the cornerstone of modern semiconductor and microelectronics industries. With the continuous development of various advanced technologies, third generation semiconductor materials, such as gallium nitride and silicon carbide, are no longer able to meet the growing demand for semiconductor diodes.

In recent years, people have proposed the fourth generation semiconductor materials, a new type of metal oxide semiconductor—gallium oxide, which exists stably under atmospheric conditions. Compared with the third generation semiconductor materials, gallium oxide has excellent characteristics such as a larger bandgap width, larger Baliga's figure of merit, and higher breakdown field strength. Therefore, gallium oxide materials are widely used in the preparation process of diodes.

However, the technical solutions for preparing diodes using gallium oxide require forming an epitaxial gallium oxide layer on the substrate. However, the epitaxial gallium oxide layer is not only difficult to effectively control thickness uniformity and doping concentration uniformity, but also likely to produce epitaxial defects such as precipitation, dislocation rings or edge dislocations. This not only reduces the performance and yield of diode devices, but also increases the production cost of diode devices.

SUMMARY

These and other problems are generally solved or circumvented, and technical advantages are generally achieved, by embodiments of the present application which provide a method for preparing a Schottky diode and a Schottky diode.

Technical Problems

The present application provides a method for preparing a Schottky diode and a Schottky diode, which can achieve the preparation of Schottky diodes using only $N^+$-type gallium oxide single crystal substrates without the need for gallium oxide epitaxial process, thereby solving the problems of poor performance, low yield, and high production cost of diode devices caused by epitaxial gallium oxide layers.

Technical Solutions

In a first aspect, embodiments of the present application provide a method for preparing a Schottky diode, including:

oxidizing a target $N^+$-type gallium oxide substrate by using a high temperature thermal oxidation process, to obtain a first $N^-$-type gallium oxide drift layer formed on an upper surface of the target $N^+$-type gallium oxide substrate and a second $N^-$-type gallium oxide drift layer formed on a lower surface of the target $N^+$-type gallium oxide substrate; preparing a first anode electrode on an upper surface of the first $N^-$-type gallium oxide drift layer and a second anode electrode on a lower surface of the second $N^-$-type gallium oxide drift layer; cutting the target $N^+$-type gallium oxide substrate, to obtain a first $N^+$-type gallium oxide substrate and a second $N^+$-type gallium oxide substrate, wherein, an upper surface of the first $N^+$-type gallium oxide substrate is formed the first $N^-$-type gallium oxide drift layer, and a lower surface of the second $N^+$-type gallium oxide substrate is formed the second $N^-$-type gallium oxide drift layer; and preparing a first cathode electrode on a lower surface of the first $N^+$-type gallium oxide substrate and a second cathode electrode on an upper surface of the second $N^+$-type gallium oxide substrate, to obtain two Schottky diodes.

In one possible embodiment, a contact between the first cathode electrode and the first $N^+$-type gallium oxide substrate, and a contact between the second cathode electrode and the second $N^+$-type gallium oxide substrate are ohmic contacts; and a contact between the first anode electrode and the first $N^-$-type gallium oxide drift layer, and a contact between the second anode electrode and the second $N^-$-type gallium oxide drift layer are Schottky contacts.

In one possible embodiment, oxidizing the target $N^+$-type gallium oxide substrate by using the high temperature thermal oxidation process includes: according to an annealing treatment temperature pre-set and an annealing treatment time pre-set, placing the target $N^+$-type gallium oxide substrate in an oxygen environment for annealing treatment.

In one possible embodiment, the annealing treatment temperature is between 500° C. and 2200° C.; and the annealing treatment time is greater than a first preset time.

In one possible embodiment, cutting the target $N^+$-type gallium oxide substrate includes: cutting the target $N^+$-type gallium oxide substrate by using a laser cutting process or a wire cutting process.

In one possible embodiment, cutting the target $N^+$-type gallium oxide substrate includes: cutting the target $N^+$-type gallium oxide substrate by using a high energy ion implantation process.

In one possible embodiment, preparing the first anode electrode on the upper surface of the first $N^-$-type gallium oxide drift layer and the second anode electrode on the lower surface of the second $N^-$-type gallium oxide drift layer includes: preparing the first anode electrode on the upper surface of the first $N^-$-type gallium oxide drift layer and the second anode electrode on the lower surface of the second $N^-$-type gallium oxide drift layer by using an electron beam evaporation method.

In one possible embodiment, preparing the first cathode electrode on the lower surface of the first $N^+$-type gallium oxide substrate and the second cathode electrode on the upper surface of the second $N^+$-type gallium oxide substrate includes: preparing the first cathode electrode on the lower surface of the first $N^+$-type gallium oxide substrate and the second cathode electrode on the upper surface of the second $N^+$-type gallium oxide substrate by using an electron beam evaporation method.

In one possible embodiment, the first anode electrode or the second anode electrode is a nickel gold composite electrode or a platinum composite electrode.

In one possible embodiment, the first cathode electrode or the second cathode electrode is a titanium gold composite electrode or a titanium aluminum platinum composite electrode.

In one possible embodiment, before oxidizing the target $N^+$-type gallium oxide substrate by using the high temperature thermal oxidation process, the method further includes: polishing a front surface and a rear surface of a $N^+$-type gallium oxide crystal ingot; cutting the $N^+$-type gallium oxide crystal ingot after polishing, to obtain wafers with required thickness; and polishing a front surface and a rear surface of one wafer of the wafers, to obtain the target $N^+$-type gallium oxide substrate.

In one possible embodiment, after cutting the target $N^+$-type gallium oxide substrate, to obtain the first $N^+$-type gallium oxide substrate and the second $N^+$-type gallium oxide substrate, the method further includes: flattening the lower surface of the first $N^+$-type gallium oxide substrate and the upper surface of the second $N^+$-type gallium oxide substrate.

In one possible embodiment, the target $N^+$-type gallium oxide substrate is a $N^+$-type highly doped gallium oxide substrate, with a doping concentration greater than $1.0\times10^{18}$ $cm^{-3}$.

In one possible embodiment, the high temperature thermal oxidation process is a dry oxygen oxidation process, a water vapor oxidation process, or a wet oxygen oxidation process.

In a second aspect, embodiments of the present application provide a Schottky diode, which is prepared by the method for preparing the Schottky diode described in anyone of the first aspect.

Advantageous Effects of the Disclosure

Embodiments of the present application provide a method for preparing a Schottky diode and a Schottky diode, which first utilizes a high temperature thermal oxidation process to obtain a first $N^-$-type gallium oxide drift layer formed on an upper surface of the target $N^+$-type gallium oxide substrate and a second $N^-$-type gallium oxide drift layer formed on a lower surface of the target $N^+$-type gallium oxide substrate; afterwards, prepares a first anode electrode on an upper surface of the first $N^-$-type gallium oxide drift layer and a second anode electrode on a lower surface of the second $N^-$-type gallium oxide drift layer; then, cuts the target $N^+$-type gallium oxide substrate to obtain a first $N^+$-type gallium oxide substrate and a second $N^+$-type gallium oxide substrate, where an upper surface of the first $N^+$-type gallium oxide substrate is formed the first $N^-$-type gallium oxide drift layer, and a lower surface of the second $N^+$-type gallium oxide substrate is formed the second $N^-$-type gallium oxide drift layer; and prepares a first cathode electrode on a lower surface of the first $N^+$-type gallium oxide substrate and a second cathode electrode on an upper surface of the second $N^+$-type gallium oxide substrate, to obtain two Schottky diodes.

Due to the fact that the present application directly obtains the first $N^-$-type gallium oxide drift layer and the second $N^-$-type gallium oxide drift layer on the $N^+$-type gallium oxide substrate, and then cuts the $N^+$-type gallium oxide substrate, dividing the $N^+$-type gallium oxide substrate in half to obtain two Schottky diodes, the present application not only does not need to extend the gallium oxide material on the substrate to obtain the gallium oxide drift layer. It solves the problems of epitaxial defects caused by epitaxial gallium oxide layers and difficulty in controlling thickness uniformity and doping concentration uniformity. It can also fully utilize $N^+$-type gallium oxide substrate to increase production capacity. Therefore, the present application not only improves the performance and yield of the diode device, but also reduces the production cost of the diode device.

BRIEF DESCRIPTION OF THE DRAWINGS

In order to provide a clearer explanation of the technical solution in the embodiments of the present application, a brief introduction will be given to the drawings required in the embodiments or existing technical descriptions. It is evident that the drawings in the following description are only some embodiments of the present application. For ordinary technical personnel in the art, other drawings can be obtained based on these drawings without any creative labor.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

In the following description, specific details such as specific system structures and technologies are proposed for the purpose of illustration rather than limitation, in order to fully understand the embodiments of the present application. However, those skilled in the art should be aware that the present application can also be implemented in other embodiments without these specific details. In other cases, detailed descriptions of well-known systems, devices, circuits, and methods are omitted to avoid unnecessary details hindering the description of the present application.

To make the purpose, technical solution, and advantages of this application clearer, specific embodiments will be explained below in conjunction with the drawings.

Figure 1:
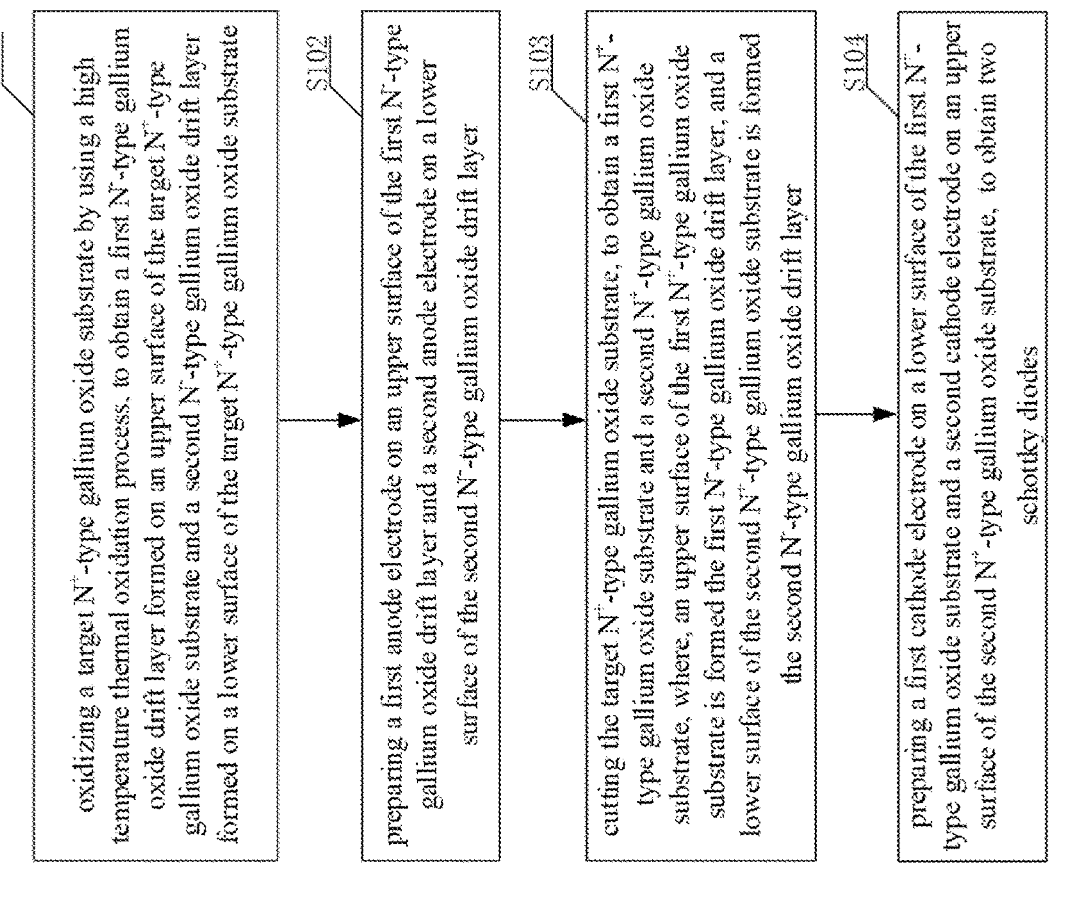
FIG. 1 is an implementation flowchart of a method for preparing a Schottky diode provided by one embodiment of the present application.

FIG. 1 is a flowchart of a method for preparing a Schottky diode provided in the embodiments of the present application, which is described as follows.

Step 101, oxidizing a target $N^+$-type gallium oxide substrate by using a high temperature thermal oxidation process, to obtain a first $N^-$-type gallium oxide drift layer formed on an upper surface of the target $N^+$-type gallium oxide substrate and a second $N^-$-type gallium oxide drift layer formed on a lower surface of the target $N^+$-type gallium oxide substrate.

In some embodiments, before using the high temperature thermal oxidation process to oxidize the target $N^+$-type gallium oxide substrate, the $N^+$-type gallium oxide crystal ingot may be treated to obtain the target $N^+$-type gallium oxide substrate.

Specifically, the process of obtaining the target $N^+$-type gallium oxide substrate through $N^+$-type gallium oxide crystal ingot is as follows:

1. selecting one $N^+$-type gallium oxide crystal ingot and polishing a front surface and a rear surface of the $N^+$-type gallium oxide crystal ingot;
2. cutting the $N^+$-type gallium oxide crystal ingot after polishing, to obtain several wafers with required thickness; and
3. polishing a front surface and a rear surface of one wafer of the several wafers, to obtain the target $N^+$-type gallium oxide substrate.

It should be noted that the target $N^+$-type gallium oxide substrate is one of the polished several wafers.

In some embodiments, the target $N^+$-type gallium oxide substrate may be a $N^+$-type highly doped gallium oxide substrate, and the doping concentration of the $N^+$-type highly doped gallium oxide substrate may be greater than $1.0\times10^{18}$ $cm^{-3}$.

In some embodiments, the high temperature thermal oxidation process may be anyone of the methods of dry oxygen oxidation, water vapor oxidation, and wet oxygen oxidation.

Specifically, the characteristics of dry oxygen oxidation are dense structure, good uniformity, repeatability, and slow generation rate; the characteristic of water vapor oxidation is fast growth rate but loose structure; the characteristic of wet oxygen oxidation is that the growth rate is between dry oxygen oxidation and water vapor oxidation, and the uniformity can meet the process requirements.

Therefore, the present application does not limit the specific implementation methods of the high temperature thermal oxidation process. The specific implementation methods of the high temperature thermal oxidation process may be adjusted according to actual needs.

In some embodiments, the use of the high temperature thermal oxidation process can reduce the conductivity of the target $N^+$-type gallium oxide substrate, thereby significantly reducing the carrier concentration on the upper and lower surfaces of the target $N^+$-type gallium oxide substrate within a certain thickness, resulting in the formation of the first $N^-$-type gallium oxide drift layer on the upper surface of the target $N^+$-type gallium oxide substrate and the second $N^-$-type gallium oxide drift layer on the lower surface of the target $N^+$-type gallium oxide substrate.

Specifically, the thickness and the carrier concentration of the $N^-$-type gallium oxide drift layer may be controlled by controlling the temperature and the processing time of the high temperature thermal oxidation process. Taking the present application as an example, when the temperature is higher and the processing time is longer, the carrier concentration is lower, and the thickness of the $N^-$-type gallium oxide drift layer is thicker.

In some embodiments, the specific implementation steps of the high temperature thermal oxidation process are: according to an annealing treatment temperature pre-set and an annealing treatment time pre-set, placing the target $N^+$-type gallium oxide substrate in an oxygen environment for annealing treatment.

It is worth mentioning that the high temperature thermal oxidation process is equivalent to oxygen annealing treatment.

Where the annealing treatment temperature may be between 500° C. and 2200° C.; and the annealing treatment time may be any time value greater than a first preset time, or the annealing treatment time may be equal to the first preset time. In the present application, there is no restriction on the value of the first preset time, for example, the first preset time may be 1 minute, 2 minutes, or 3 minutes, etc. The annealing treatment temperature may be 500° C., 1350° C., or 2200° C., and the annealing treatment temperature and the annealing treatment time may be selected according to actual needs.

In one possible implementation, the high temperature thermal oxidation treatment of the target $N^+$-type gallium oxide substrate can make the target $N^+$-type gallium oxide material more stable.

Figure 2:
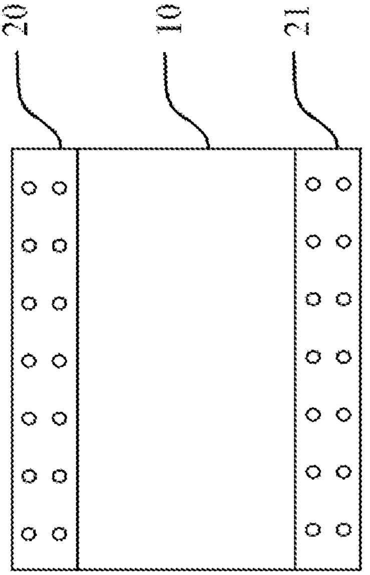
FIG. 2 is a schematic diagram of a first $N^-$-type gallium oxide drift layer and a second $N^-$-type gallium oxide drift layer provided by one embodiment of the present application.

As shown in FIG. 2, the first $N^-$-type gallium oxide drift layer of the required thickness is formed on the upper surface of the target $N^+$-type gallium oxide substrate, and the second $N^-$-type gallium oxide drift layer of the required thickness is formed on the lower surface of the target $N^+$-type gallium oxide substrate. In FIG. 2, 10 is the target $N^+$-type gallium oxide substrate, 20 is the first $N^-$-type gallium oxide drift layer, and 21 is the second $N^-$-type gallium oxide drift layer.

Step 102, preparing a first anode electrode on an upper surface of the first $N^-$-type gallium oxide drift layer and a second anode electrode on a lower surface of the second $N^-$-type gallium oxide drift layer.

In some embodiments, the first anode electrode or the second anode electrode may be a composite electrode composed of nickel gold or a composite electrode composed of platinum. The contact between the first anode electrode and the first $N^-$-type gallium oxide drift layer, and the contact between the second anode electrode and the second $N^-$-type gallium oxide drift layer are Schottky contacts.

In some embodiments, the first anode electrode may be prepared on the upper surface of the first $N^-$-type gallium oxide drift layer by electron beam evaporation method, and the second anode electrode may be prepared on the lower surface of the second $N^-$-type gallium oxide drift layer by electron beam evaporation method.

Specifically, the electron beam evaporation method refers to the process of heating the metal in a crucible under high vacuum, causing it to melt and evaporate onto the desired substrate to form a metal film.

In combination with the material of the anode electrode in the present application, when preparing the anode electrode, the metal in the crucible may be nickel, gold, or platinum, gold. After melting, a high temperature alloy is obtained to obtain a composite electrode.

Figure 3:
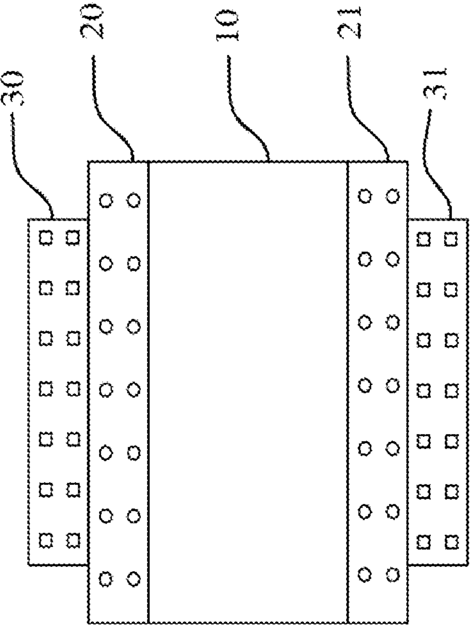
FIG. 3 is a schematic diagram of an anode electrode provided by one embodiment of the present application.

As shown in FIG. 3, preparing the first anode electrode on the upper surface of the first $N^-$-type gallium oxide drift layer and the second anode electrode on the lower surface of the second $N^-$-type gallium oxide drift layer. In FIG. 3, 30 is the first anode electrode, and 31 is the second anode electrode.

Step 103, cutting the target $N^+$-type gallium oxide substrate, to obtain a first $N^+$-type gallium oxide substrate and a second $N^+$-type gallium oxide substrate, where, an upper surface of the first $N^+$-type gallium oxide substrate is formed the first $N^-$-type gallium oxide drift layer, and a lower surface of the second $N^+$-type gallium oxide substrate is formed the second $N^-$-type gallium oxide drift layer.

In some embodiments, the target $N^+$-type gallium oxide substrate may be cut through a laser cutting process, a wire cutting process, or a high energy ion implantation process.

Specifically, the laser cutting process refers to the use of a focusing mirror to focus a $CO_2$ laser beam on the surface of a material to melt it, while using compressed gas coaxial with the laser beam to blow away the melted material and causing the laser beam to move relative to the material along a certain trajectory, thus forming a certain shape of cutting seam.

The steps of the laser cutting process applied to the present application may be:

1. fixing the target $N^+$-type gallium oxide substrate with the first $N^-$-type gallium oxide drift layer, the second $N^-$-type gallium oxide drift layer and the two anode electrodes on a cutting machine tool;
2. using the laser cutting process to melt the material on the surface of the target $N^+$-gallium oxide substrate;
3. forming a cutting seam in the middle of the target $N^+$-type gallium oxide substrate to obtain the first $N^+$-type gallium oxide substrate and the second $N^+$-type gallium oxide substrate.

It should be noted that using the laser cutting technology can greatly reduce processing time, reduce processing costs, and improve device quality.

Specifically, the wire cutting process is developed on the basis of electric discharge perforation and forming processing. It refers to the processing method of using moving metal wire (molybdenum wire, copper wire, or alloy wire) as electrode wire, and using pulse electric discharge between the electrode wire and the workpiece to generate high temperature, causing the surface of the material to melt or vaporize, forming cutting seam, and cutting out parts.

The steps of the wire cutting process applied to the present application may be:

1. fixing the target $N^+$-type gallium oxide substrate with the first $N^-$-type gallium oxide drift layer, the second $N^-$-type gallium oxide drift layer and the two anode electrodes on a cutting machine tool;
2. turning on a cutting equipment and moving the metal wire to the position where the target $N^+$-type gallium oxide substrate is located;
3. generating a discharge reaction between the metal wire and the target $N^+$-type gallium oxide substrate and causing the material in the middle of the target $N^+$-type gallium oxide substrate to melt;
4. forming a cutting seam in the middle of the target $N^+$-type gallium oxide substrate to obtain the first $N^+$-type gallium oxide substrate and the second $N^+$-type gallium oxide substrate.

It should be noted that using the wire cutting technology can save costs and expenses, and wire cutting also has the characteristics of low energy consumption and no pollution.

Specifically, the ion implantation process refers to the process of accelerating ion beams to a certain energy and then injecting them into the surface of a solid material to change the physical properties of the material surface.

The steps of the ion implantation process applied to the present application may be: accelerating the ion beam to high energy, and then injecting the high energy ions into the surface of the target $N^+$-type gallium oxide substrate, forming a cutting seam in the middle of the target $N^+$-type gallium oxide substrate to obtain the first $N^+$-type gallium oxide substrate and the second $N^+$-type gallium oxide substrate.

It should be noted that the present application does not limit the types of ion beams, and the specific type of ion beam used may be adjusted according to actual needs. For example, using high energy and high concentration hydrogen ion implantation methods to achieve intelligent cutting.

In one possible implementation, the high energy ion implantation process has the characteristics of good controllability, flexible process, good uniformity and repeatability, and small lateral expansion. The use of high energy ion implantation process helps to improve the operating frequency of the device.

In one possible implementation, by cutting the target $N^+$-type gallium oxide substrate, the target $N^+$-type gallium oxide substrate may be divided in half, achieving the separation of the target $N^+$-type gallium oxide substrate and preparing two Schottky diodes. This results in more Schottky diodes being produced while limiting costs, increasing production volume and reducing production costs.

In some embodiments, the first $N^+$-type gallium oxide substrate and the first $N^-$-type gallium oxide drift layer are one part, and the second $N^+$-type gallium oxide substrate and the second $N^-$-type gallium oxide drift layer are another part.

Figure 4:
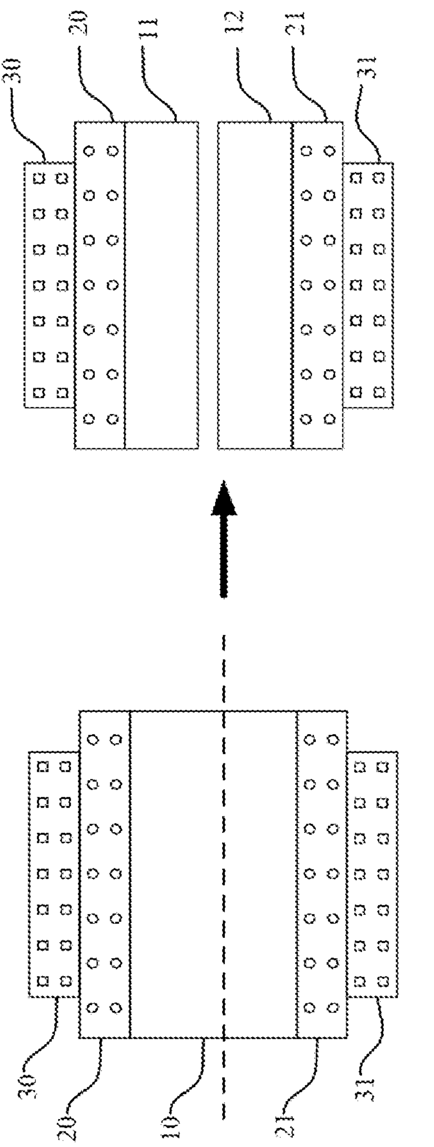
FIG. 4 is a schematic diagram of a cutting process and a cutting result provided by one embodiment of the present application.

As shown in FIG. 4, cutting the target $N^+$-type gallium oxide substrate, to obtain the first $N^+$-type gallium oxide substrate and the second $N^+$-type gallium oxide substrate. In FIG. 4, 11 is the first $N^+$-type gallium oxide substrate, and 12 is the second $N^+$-type gallium oxide substrate.

It is worth mentioning that after cutting the target $N^+$-type gallium oxide substrate, in order to ensure the smooth preparation of the cathode electrodes, it is also necessary to polish and level the lower surface of the first $N^+$-type gallium oxide substrate and the upper surface of the second $N^+$-type gallium oxide substrate. Flattening the surface of devices can reduce preparation errors and preparation mistakes, resulting in more exquisite devices.

Step 104, preparing a first cathode electrode on a lower surface of the first $N^+$-type gallium oxide substrate and a second cathode electrode on an upper surface of the second $N^+$-type gallium oxide substrate, to obtain two Schottky diodes.

In some embodiments, the first cathode electrode or the second cathode electrode may be a composite electrode composed of titanium gold or a composite electrode composed of titanium aluminum platinum. The contact between the first cathode electrode and the first $N^+$-type gallium oxide substrate, and the contact between the second cathode electrode and the second $N^+$-type gallium oxide substrate are ohmic contacts.

In some embodiments, the first cathode electrode and the second cathode electrode may be prepared by electron beam evaporation method on the lower surface of the first $N^+$-type gallium oxide substrate and the upper surface of the second $N^+$-type gallium oxide substrate, respectively.

Specifically, the electron beam evaporation method refers to the process of heating the metal in a crucible under high vacuum, causing it to melt and evaporate onto the desired substrate to form a metal film. In the present application, when preparing the cathode electrode, the metal in the crucible may be titanium, gold, or titanium, aluminum, platinum, and gold. After melting, a high temperature alloy is obtained to obtain a composite electrode.

Figure 5:
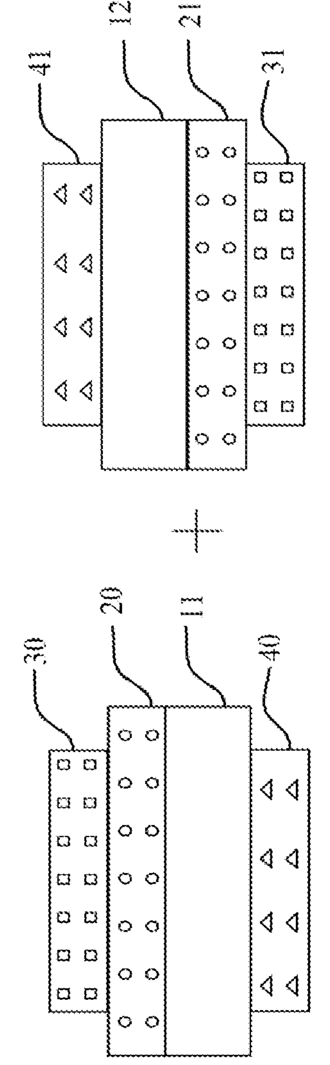
FIG. 5 is a schematic diagram of a cathode electrode provided by one embodiment of the present application.

As shown in FIG. 5, preparing the first cathode electrode on the lower surface of the first $N^+$-type gallium oxide substrate and the second cathode electrode on the upper surface of the second $N^+$-type gallium oxide substrate. In FIG. 5, 40 is the first cathode electrode, and 41 is the second cathode electrode.

In some embodiments, if the thickness of the target $N^+$-type gallium oxide substrate is too large, the target $N^+$-type gallium oxide substrate may be divided into a first $N^+$-type gallium oxide substrate, a second $N^+$-type gallium oxide substrate, and a wafer of the required thickness. The obtained wafer can continue the preparation process of Schottky diodes according to the steps shown in the present application until the wafer is fully utilized.

Embodiments of the present application provide a method for preparing a Schottky diode and a Schottky diode, which first utilizes a high temperature thermal oxidation process to obtain a first $N^-$-type gallium oxide drift layer formed on an upper surface of the target $N^+$-type gallium oxide substrate and a second $N^-$-type gallium oxide drift layer formed on a lower surface of the target $N^+$-type gallium oxide substrate; afterwards, prepares a first anode electrode on an upper surface of the first $N^-$-type gallium oxide drift layer and a second anode electrode on a lower surface of the second $N^-$-type gallium oxide drift layer; then, cuts the target $N^+$-type gallium oxide substrate to obtain a first $N^+$-type gallium oxide substrate and a second $N^+$-type gallium oxide substrate, where an upper surface of the first $N^+$-type gallium oxide substrate is formed the first $N^-$-type gallium oxide drift layer, and a lower surface of the second $N^+$-type gallium oxide substrate is formed the second $N^-$-type gallium oxide drift layer; and prepares a first cathode electrode on a lower surface of the first $N^+$-type gallium oxide substrate and a second cathode electrode on an upper surface of the second $N^+$-type gallium oxide substrate, to obtain two Schottky diodes. Due to the fact that the present application directly obtains the first $N^-$-type gallium oxide drift layer and the second $N^-$-type gallium oxide drift layer on the $N^+$-type gallium oxide substrate, and then cuts the $N^+$-type gallium oxide substrate, dividing the $N^+$-type gallium oxide substrate in half to obtain two Schottky diodes, the present application not only does not need to extend the gallium oxide material on the substrate to obtain the gallium oxide drift layer. It solves the problems of epitaxial defects caused by epitaxial gallium oxide layers and difficulty in controlling thickness uniformity and doping concentration uniformity. It can also fully utilize $N^+$-type gallium oxide substrate to increase production capacity. Therefore, the present application not only improves the performance and yield of the diode device, but also reduces the production cost of the diode device.

It should be understood that the size of the sequence numbers of each step in the above embodiments does not imply the order of execution. The execution order of each process should be determined based on its function and internal logic, and should not constitute any restrictions on the implementation process of embodiments of the present application.

Corresponding to the method for preparing the Schottky diode in the previous embodiments, the present application also provides a Schottky diode. The Schottky diode is prepared using the method for preparing the Schottky diode of anyone of the above embodiments, and has beneficial effects when operated using the method for preparing the Schottky diode of anyone of the above embodiments. The Schottky diode consists of sequentially stacked anode electrode, $N^-$-type gallium oxide drift layer, $N^+$-type gallium oxide substrate, and cathode electrode.

In some embodiments, the Schottky diode provided in the present application has the advantages of low forward conduction voltage drop, fast recovery time, low junction capacitance, high current density, and low noise, which can be widely applied in fields such as circuits, chips, automobiles, and communication.

The above embodiments are only used to illustrate the technical solution of the present application, not to limit it; although the present application has been described in detail with reference to the aforementioned embodiments, ordinary technical personnel in the art should understand that they can still modify the technical solutions recorded in the aforementioned embodiments or equivalently replace some of the technical features; these modifications or substitutions do not separate the essence of the corresponding technical solutions from the spirit and scope of the technical solutions in each embodiment of the present application, and should be included in the scope of protection of the present application.

What is claimed is:

1. A method for preparing a Schottky diode, comprising:

oxidizing a target $N^+$-type gallium oxide substrate by using a high temperature thermal oxidation process, to obtain a first $N^-$-type gallium oxide drift layer formed on an upper surface of the target $N^+$-type gallium oxide substrate and a second $N^-$-type gallium oxide drift layer formed on a lower surface of the target $N^+$-type gallium oxide substrate;

preparing a first anode electrode on an upper surface of the first $N^-$-type gallium oxide drift layer and a second anode electrode on a lower surface of the second $N^-$-type gallium oxide drift layer;

cutting the target $N^+$-type gallium oxide substrate, to obtain a first $N^+$-type gallium oxide substrate and a second $N^+$-type gallium oxide substrate, wherein, an upper surface of the first $N^+$-type gallium oxide substrate is formed the first $N^-$-type gallium oxide drift layer, and a lower surface of the second $N^+$-type gallium oxide substrate is formed the second $N^-$-type gallium oxide drift layer; and preparing a first cathode electrode on a lower surface of the first $N^+$-type gallium oxide substrate and a second cathode electrode on an upper surface of the second $N^+$-type gallium oxide substrate, to obtain two Schottky diodes.

2. The method according to claim 1, wherein a contact between the first cathode electrode and the first $N^+$-type gallium oxide substrate, and a contact between the second cathode electrode and the second $N^+$-type gallium oxide substrate are ohmic contacts; and a contact between the first anode electrode and the first $N^-$-type gallium oxide drift layer, and a contact between the second anode electrode and the second $N^-$-type gallium oxide drift layer are Schottky contacts.

3. The method according to claim 1, wherein oxidizing the target $N^+$-type gallium oxide substrate by using the high temperature thermal oxidation process comprises:

according to an annealing treatment temperature pre-set and an annealing treatment time pre-set, placing the target $N^+$-type gallium oxide substrate in an oxygen environment for annealing treatment.

4. The method according to claim 3, wherein the annealing treatment temperature is between 500° C. and 2200° C.; and the annealing treatment time is greater than a first preset time.

5. The method according to claim 1, wherein cutting the target $N^+$-type gallium oxide substrate comprises:

cutting the target $N^+$-type gallium oxide substrate by using a laser cutting process or a wire cutting process.

6. The method according to claim 1, wherein cutting the target $N^+$-type gallium oxide substrate comprises:

cutting the target $N^+$-type gallium oxide substrate by using a high energy ion implantation process.

7. The method according to claim 1, wherein preparing the first anode electrode on the upper surface of the first $N^-$-type gallium oxide drift layer and the second anode electrode on the lower surface of the second $N^-$-type gallium oxide drift layer comprises:

preparing the first anode electrode on the upper surface of the first $N^-$-type gallium oxide drift layer and the second anode electrode on the lower surface of the second $N^-$-type gallium oxide drift layer by using an electron beam evaporation method.

8. The method according to claim 1, wherein preparing the first cathode electrode on the lower surface of the first $N^+$-type gallium oxide substrate and the second cathode electrode on the upper surface of the second $N^+$-type gallium oxide substrate comprises:

preparing the first cathode electrode on the lower surface of the first $N^+$-type gallium oxide substrate and the second cathode electrode on the upper surface of the second $N^+$-type gallium oxide substrate by using an electron beam evaporation method.

9. The method according to claim 1, wherein the first anode electrode or the second anode electrode is a nickel gold composite electrode or a platinum composite electrode.

10. The method according to claim 1, wherein the first cathode electrode or the second cathode electrode is a titanium gold composite electrode or a titanium aluminum platinum composite electrode.

11. The method according to claim 1, wherein before oxidizing the target $N^+$-type gallium oxide substrate by using the high temperature thermal oxidation process, the method further comprises:

polishing a front surface and a rear surface of a $N^+$-type gallium oxide crystal ingot;

cutting the $N^+$-type gallium oxide crystal ingot after polishing, to obtain wafers with required thickness; and polishing a front surface and a rear surface of one wafer of the wafers, to obtain the target $N^+$-type gallium oxide substrate.

12. The method according to claim 1, wherein after cutting the target $N^+$-type gallium oxide substrate, to obtain the first $N^+$-type gallium oxide substrate and the second $N^+$-type gallium oxide substrate, the method further comprises:

flattening the lower surface of the first $N^+$-type gallium oxide substrate and the upper surface of the second $N^+$-type gallium oxide substrate.

13. The method according to claim 1, wherein the target $N^+$-type gallium oxide substrate is a $N^+$-type highly doped gallium oxide substrate, with a doping concentration greater than $1.0\times10^{18}$ $cm^{-3}$.

14. The method according to claim 1, wherein the high temperature thermal oxidation process is a dry oxygen oxidation process, a water vapor oxidation process, or a wet oxygen oxidation process.

* * * * *